(12) United States Patent
Umeda et al.

(10) Patent No.: US 12,040,167 B2
(45) Date of Patent: Jul. 16, 2024

(54) DIAGNOSIS APPARATUS, PLASMA PROCESSING APPARATUS AND DIAGNOSIS METHOD

(71) Applicant: Hitachi High-Tech Corporation, Tokyo (JP)

(72) Inventors: Shota Umeda, Tokyo (JP); Kenji Tamaki, Tokyo (JP); Masahiro Sumiya, Tokyo (JP); Masaki Ishiguro, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/971,255

(22) PCT Filed: Jul. 30, 2019

(86) PCT No.: PCT/JP2019/029762
§ 371 (c)(1),
(2) Date: Aug. 19, 2020

(87) PCT Pub. No.: WO2020/152889
PCT Pub. Date: Jul. 30, 2020

(65) Prior Publication Data
US 2022/0157580 A1 May 19, 2022

(51) Int. Cl.
*H01J 37/32* (2006.01)
*G01M 99/00* (2011.01)
*G06N 7/01* (2023.01)

(52) U.S. Cl.
CPC ..... *H01J 37/32917* (2013.01); *G01M 99/005* (2013.01); *G06N 7/01* (2023.01); *H01J 2237/24578* (2013.01)

(58) Field of Classification Search
CPC ..... H01J 37/32917; H01J 2237/24578; G01M 99/005; G06N 7/005
See application file for complete search history.

(56) References Cited

U.S. PATENT DOCUMENTS 5,347,460 A * 9/1994 Gifford ............. H01L 21/67253
700/121
2002/0174952 A1* 11/2002 Maher ............... H01L 21/67742
156/345.31
(Continued)

FOREIGN PATENT DOCUMENTS

JP  2002270581 A   9/2002
JP  2003347275 A   12/2003
(Continued)

OTHER PUBLICATIONS

Han et al., 2012, KR101117928B1, downloaded from Espacenet on Jun. 16, 2022 (Year: 2012).*
(Continued)

*Primary Examiner* — Lina Cordero
*Assistant Examiner* — Lyudmila Zaykova-Feldman
(74) *Attorney, Agent, or Firm* — Miles & Stockbridge, P.C.

(57) ABSTRACT

In a diagnosis apparatus for diagnosing a state of a plasma processing apparatus, prior distribution information including a probability distribution function is previously obtained for each of first sensors by using first sensor values obtained by the first sensors in a first plasma processing apparatus, a probability distribution in each of second sensors corresponding to each of the first sensors is estimated based on the previously obtained prior distribution information and second sensor values obtained by the second sensors in a second plasma processing apparatus different from the first plasma processing apparatus, and a state of the second plasma processing apparatus is diagnosed by using the estimated probability distribution.

7 Claims, 8 Drawing Sheets

(56) References Cited

U.S. PATENT DOCUMENTS

| | | | | |
|---|---|---|---|---|
| 2003/0178140 A1* | 9/2003 | Hanazaki | ......... | H01J 37/32935 |
| | | | | 118/712 |
| 2004/0010399 A1* | 1/2004 | Kadane | ................... | G06F 17/18 |
| | | | | 703/2 |
| 2004/0067645 A1* | 4/2004 | Chen | ................. | H01J 37/32935 |
| | | | | 438/689 |
| 2005/0143852 A1* | 6/2005 | Roover | ................... | G05B 17/02 |
| | | | | 700/121 |
| 2006/0153451 A1* | 7/2006 | Hong | ...................... | G06T 7/143 |
| | | | | 382/173 |
| 2007/0021890 A1* | 1/2007 | Ide | ....................... | G05B 23/024 |
| | | | | 701/44 |
| 2010/0161278 A1* | 6/2010 | Miyano | ............. | H01J 37/32935 |
| | | | | 702/183 |
| 2012/0101758 A1* | 4/2012 | Ogi | .................. | G05B 19/41875 |
| | | | | 702/81 |
| 2013/0008605 A1* | 1/2013 | Yin | ................... | H01L 21/67161 |
| | | | | 156/345.29 |
| 2013/0045547 A1 | 2/2013 | Izawa et al. | | |
| 2015/0064923 A1* | 3/2015 | Matsumoto | ....... | H01J 37/32935 |
| | | | | 156/345.24 |
| 2016/0155611 A1* | 6/2016 | Kagoshima | ............. | C23C 16/50 |
| | | | | 118/723 R |
| 2016/0314982 A1* | 10/2016 | Kihara | .............. | H01L 21/31116 |
| 2017/0255871 A1* | 9/2017 | Macready | ................ | G06N 7/01 |
| 2018/0107574 A1* | 4/2018 | Hara | ................... | G06F 11/3419 |
| 2018/0350643 A1* | 12/2018 | Kapoor | ............. | H01J 37/32174 |
| 2020/0333777 A1 | 10/2020 | Maruyama | | |

FOREIGN PATENT DOCUMENTS

| | | | |
|---|---|---|---|
| JP | 2010165949 A | | 7/2010 |
| JP | 2010-283000 A | | 12/2010 |
| JP | 2012-009064 A | | 1/2012 |
| JP | 2013041954 A | | 2/2013 |
| JP | 2014022695 A | * | 2/2014 |
| JP | 2014022695 A | | 2/2014 |
| KR | 101117928 B1 | * | 2/2012 |
| WO | 2018061842 A1 | | 4/2018 |

OTHER PUBLICATIONS

Sonoda et l., 2014, JP2014022695A, Plasma processing equipment and its calibration method, downloaded from Espacenet on Apr. 26, 2022 (Year: 2014).*

Search Report mailed Sep. 17, 2019 in corresponding International Application No. PCT/JP2019/029762.

Written Opinion mailed Sep. 17, 2019 in corresponding International Application No. PCT/JP2019/029762.

Search Report mailed Apr. 5, 2022 in International Application No. PCT/JP2022/004.

* cited by examiner

[FIG. 1]
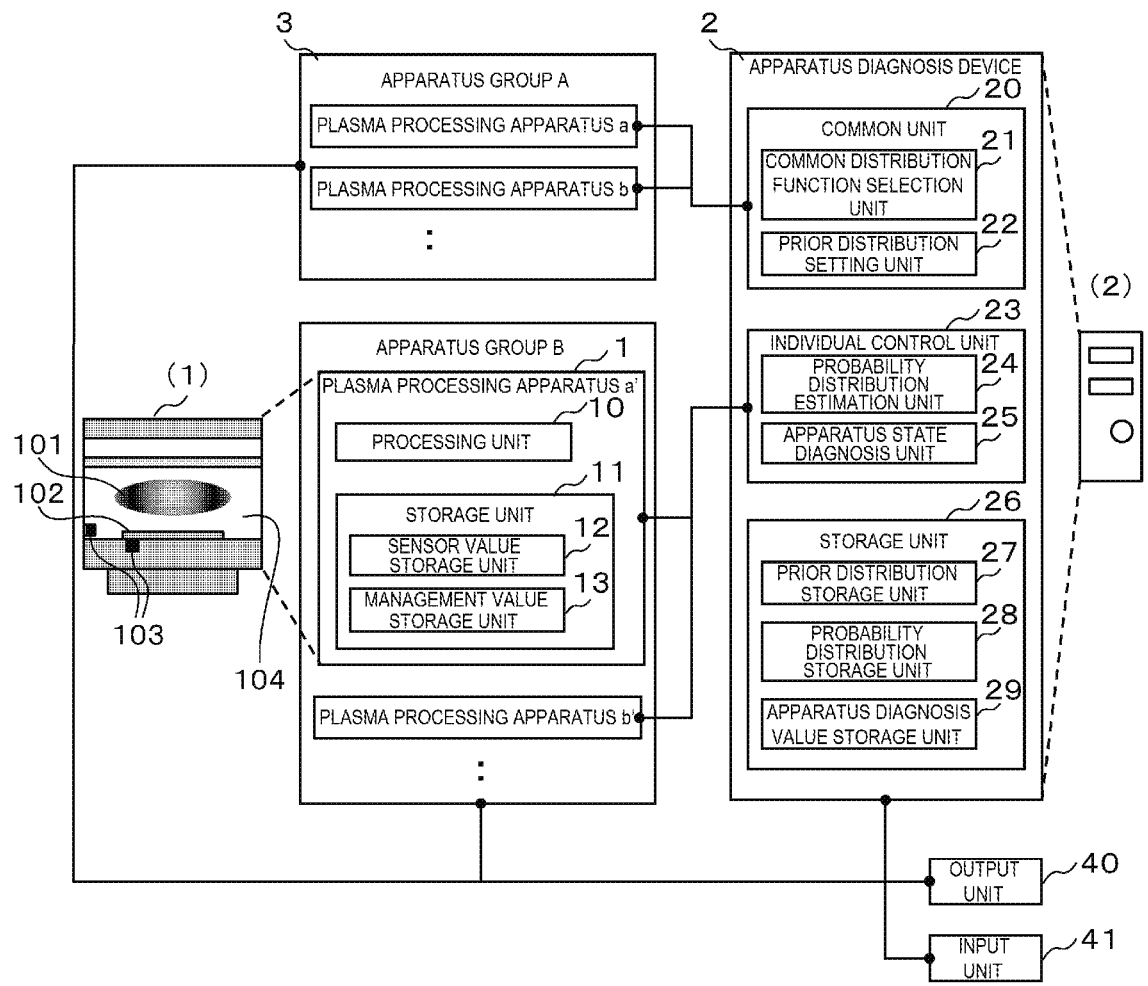

[FIG. 2]

| APPARATUS ID | PROCESSING STEP ID | PROCESSING CONDITION ID | WAFER ID | SENSOR VALUES (AVERAGE VALUES) | | | |
|---|---|---|---|---|---|---|---|
| | | | | X1 | X2 | ... | Xn |
| C1 | S1 | R1 | W1 | 102 | 1.02 | ... | 35 |
| | | | W2 | 130 | 1.13 | ... | 48 |
| | | | ... | ... | ... | ... | ... |
| | | | W480 | 117 | 0.98 | ... | 40 |
| ⋮ | ⋮ | ⋮ | ⋮ | ⋮ | ⋮ | ⋮ | ⋮ |

[FIG. 3]
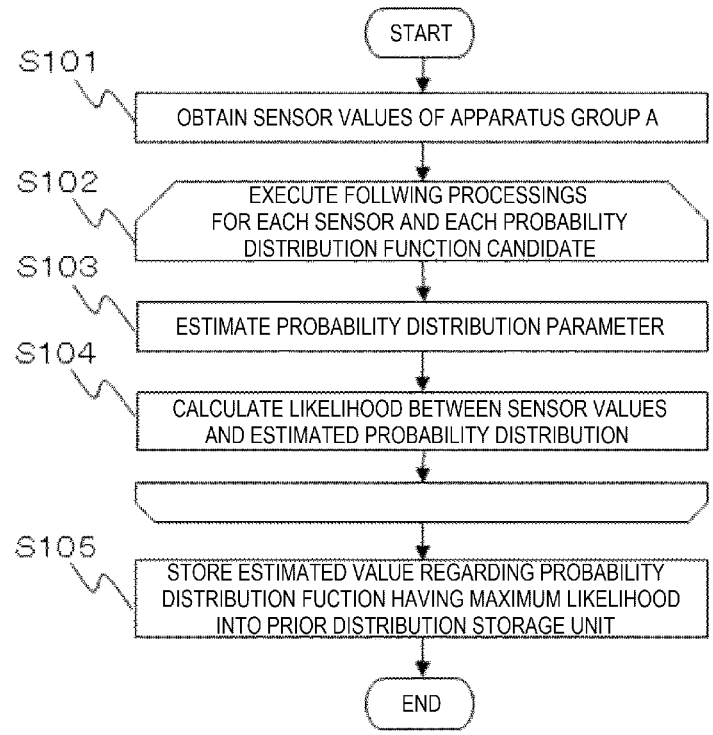
[FIG. 4]
| PROBABILITY DISTRIBUTION INFORMATION | SENSOR NAME | | | | |
|---|---|---|---|---|---|
| | X1 | X2 | | | ... |
| PROBABILITY DISTRIBUTION FUNCTION | DISTORTION NORMAL DISTRIBUTION | NORMAL DISTRIBUTION | CAUCHY DISTRIBUTION | NORMAL DISTRIBUTION | ... |
| PROBABILITY DISTRIBUTION PARAMETER | σ ~ Normal(5.5,1.8)<br>α ~ Normal(0.24, 0.5)<br>μ ~ Normal(104, 3.0) | σ ~ Normal(6.0,2.1)<br>μ ~ Normal(102, 2.7) | σ ~ Normal(0.35, 0.20)<br>μ ~ Normal(1.02, 0.12) | ... | ... |
| LOG LIKELIHOOD | 1.2 | 0.74 | 0.80 | ... | ... |

[FIG. 5]
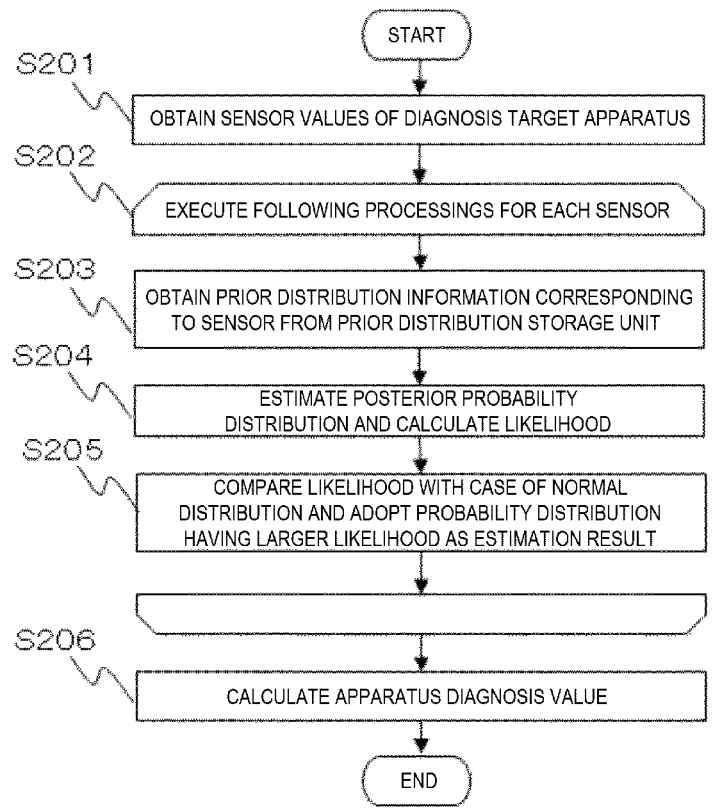
[FIG. 6A]
| PROBABILITY DISTRIBUTION INFORMATION | SENSOR NAME | | | | |
|---|---|---|---|---|---|
| | X1 | X2 | | | ... |
| PROBABILITY DISTRIBUTION FUNCTION | DISTORTION NORMAL DISTRIBUTION | NORMAL DISTRIBUTION | CAUCHY DISTRIBUTION | NORMAL DISTRIBUTION | ... ... |
| PROBABILITY DISTRIBUTION PARAMETER | $\sigma = 4.8$ $a = 0.29$ $\mu = 105$ | $\sigma = 4.8$ $\mu = 105$ | $\sigma = 0.39$ $\mu = 0.98$ | ... | ... |
| LOG LIKELIHOOD | 1.5 | 0.55 | 1.2 | ... | ... |

[FIG. 6B]

| PROBABILITY DISTRIBUTION INFORMATION | SENSOR NAME | | |
|---|---|---|---|
| | X1 | X2 | ... |
| PROBABILITY DISTRIBUTION FUNCTION | DISTORTION NORMAL DISTRIBUTION | CAUCHY DISTRIBUTION | ... |
| PROBABILITY DISTRIBUTION PARAMETER | $\sigma = 4.8$<br>$a = 0.29$<br>$\mu = 105$ | $\sigma = 0.39$<br>$\mu = 0.98$ | ... |
| LOG LIKELIHOOD | 1.5 | 1.2 | ... |

[FIG. 7]

| APPARATUS ID | C1/C2 | | | C1/C3 | ... |
|---|---|---|---|---|---|
| SENSOR NAME | X1 | X2 | ... | ... | ... |
| INTER-APPARATUS DIFFERENCE DIAGNOSIS VALUE | 5.0 | 0.2 | ... | ... | ... |

[FIG. 8]
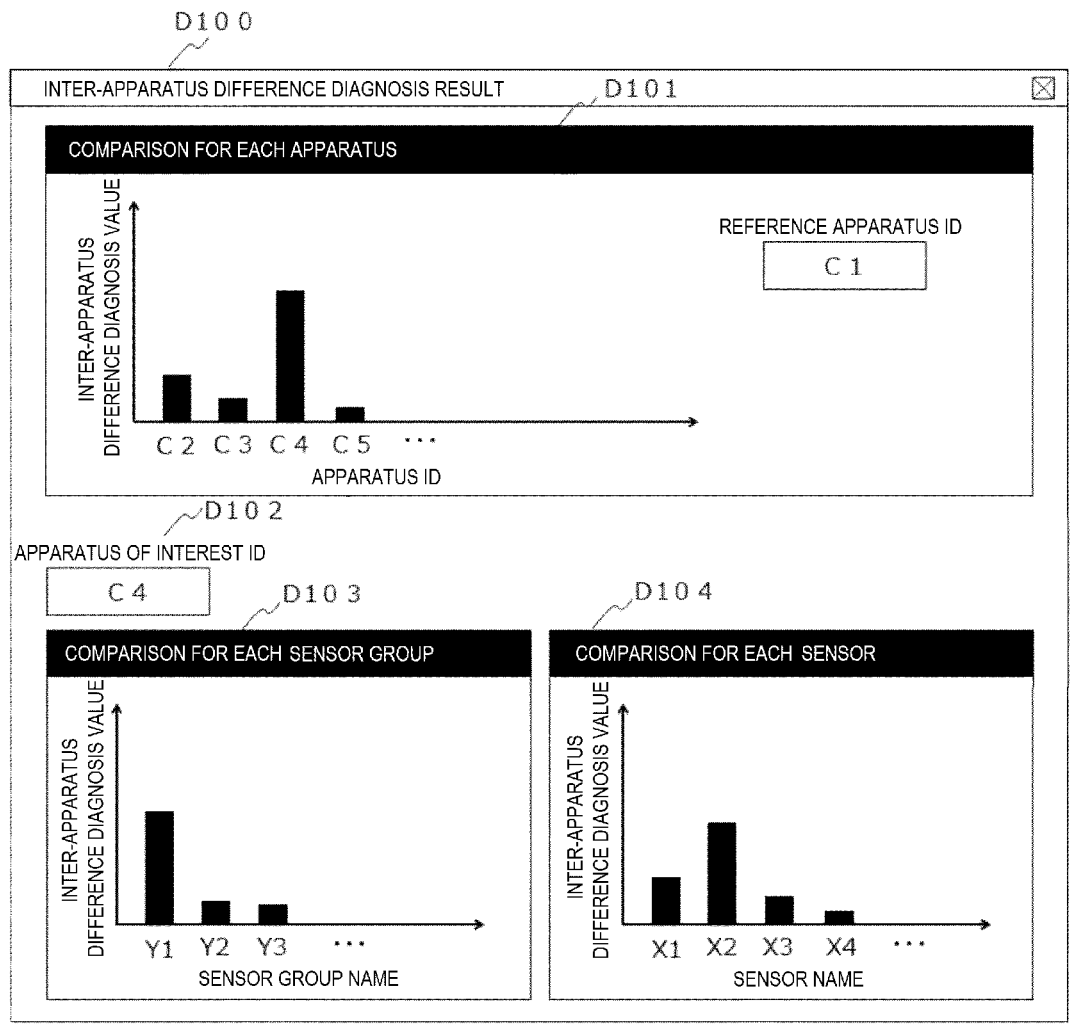

[FIG. 9]
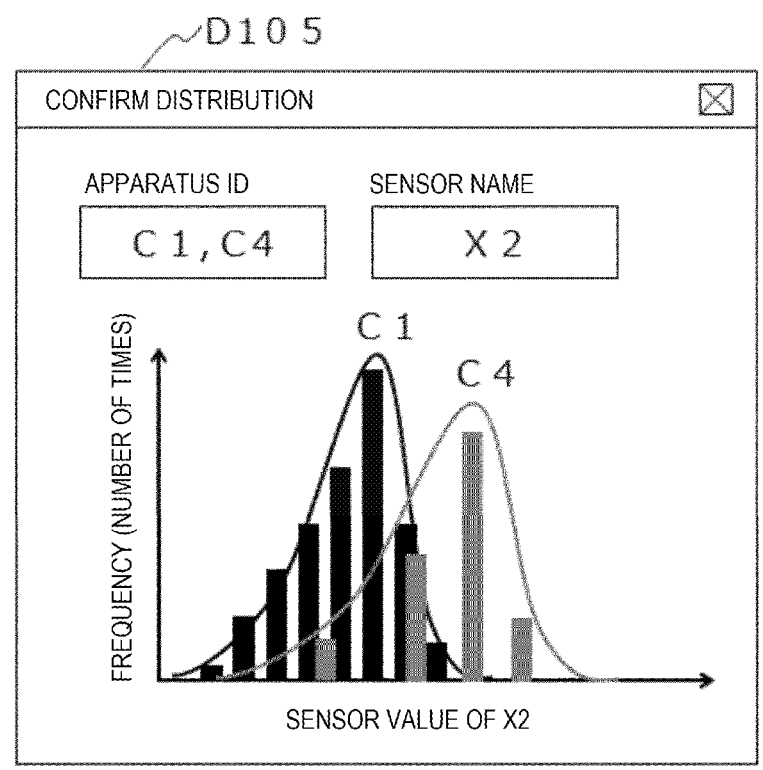

[FIG. 10]
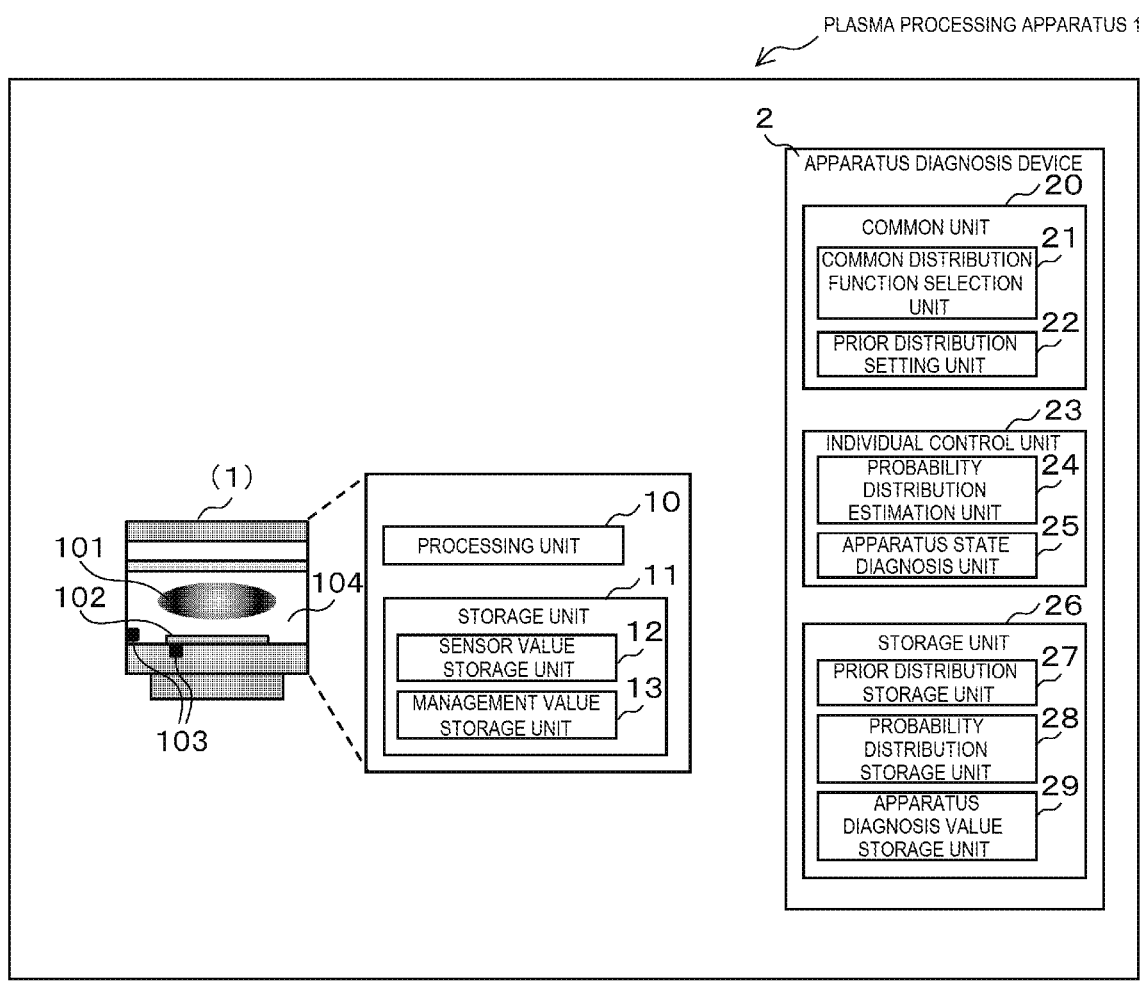

DIAGNOSIS APPARATUS, PLASMA PROCESSING APPARATUS AND DIAGNOSIS METHOD

TECHNICAL FIELD

The present invention relates to an apparatus diagnosis device, a plasma processing apparatus, and an apparatus diagnosis method.

BACKGROUND ART

In a plasma processing apparatus, a fine shape is formed on a semiconductor wafer. Therefore, a plasma processing is performed in which a substance is turned into plasma and the substance on the wafer is removed by an action of the substance.

When there is an individual difference (inter-apparatus difference) in common components used among a plurality of apparatuses during the manufacturing of the plasma processing apparatus, a difference in a plasma state occurs among individual apparatuses. Therefore, there is a problem that it takes a long time to identify and replace or adjust a causal component at a final inspection before an apparatus is shipped from an apparatus manufacturing factory. In addition, when a deterioration of consumable components used for a life longer than a life expected at a semiconductor manufacturing factory occurs after the apparatus is shipped, the inter-apparatus difference similarly occurs.

When the inter-apparatus difference occurs, there arise problems that a desired processing quality cannot be obtained and an unexpected downtime due to a component replacement occurs. Therefore, in order to speed up an adjustment or reduce the unexpected downtime, an apparatus diagnosis technique is required to estimate the inter-apparatus difference and then give feedback to an apparatus manufacturing process or to perform component deterioration diagnosis.

As such an apparatus diagnosis technique, for example, there is a PTL 1. PTL 1 discloses that "An abnormality detection device estimates a state in which noise is removed based on a summary value by applying statistical modeling to the summary value that summarizes observed values, and generates a predicted value that predicts a summary value one period ahead based on the estimation. The abnormality detection device detects whether there is an abnormality in a target apparatus to be monitored based on the predicted value."

CITATION LIST

Patent Literature

PTL 1: WO 2018/061842

SUMMARY OF INVENTION

Technical Problem

In PTL 1, since a probability distribution of measurement values (sensor values) of a state sensor of a diagnosis target apparatus is generally used for apparatus diagnosis, a probability distribution estimation technique is required. As described above, since the inter-apparatus difference may occur in the plasma processing apparatus, in the method of PTL 1, it is necessary to obtain a large amount of data for each apparatus in order to detect the abnormality with high accuracy.

However, since, for example, when starting up a new apparatus in an existing step or when applying the apparatus to a new step, it is difficult to obtain a large amount of sensor values, a method for estimating the probability distribution with a small amount of sensor values is necessary.

An object of the invention is to estimate a probability distribution with a small amount of sensor values in an apparatus diagnosis device.

Solution to Problem

In an diagnosis apparatus according to one aspect of the invention, prior distribution information including a probability distribution function is previously obtained for each of first sensors by using first sensor values obtained by the first sensors in a first plasma processing apparatus, a probability distribution in each of second sensors corresponding to each of the first sensors is estimated based on the previously obtained prior distribution information and second sensor values obtained by the second sensors in a second plasma processing apparatus different from the first plasma processing apparatus, and a state of the second plasma processing apparatus is diagnosed by using the estimated probability distribution.

In an diagnosis apparatus for diagnosing a state of a plasma processing apparatus according to one aspect of the invention, prior distribution information including a probability distribution function is previously obtained for each of first sensors by using first sensor values obtained by the first sensors in a first plasma processing apparatus, a probability distribution in each of second sensors corresponding to each of the first sensors is estimated based on the previously obtained prior distribution information and second sensor values obtained by the second sensors in a second plasma processing apparatus, and a first likelihood that is a likelihood of the estimated probability distribution and a second likelihood that is a likelihood of a normal distribution are compared. When the first likelihood is higher than the second likelihood, a state of the second plasma processing apparatus is diagnosed by using the estimated probability distribution, and when the second likelihood is higher than the first likelihood, the state of the second plasma processing apparatus is diagnosed by using the normal distribution.

A plasma processing apparatus according to one aspect of the invention includes: a processing chamber in which a sample is plasma-processed; and a diagnosis apparatus configured to diagnose a state of a self-apparatus. The apparatus diagnosis device previously obtains prior distribution information including a probability distribution function for each of first sensors by using first sensor values obtained by the first sensors in a plasma processing apparatus different from the self-apparatus, estimates a probability distribution in each of second sensors corresponding to each of the first sensors based on the previously obtained prior distribution information and second sensor values obtained by the second sensors in the self-apparatus, and diagnoses a state of the self-apparatus by using the estimated probability distribution.

In a diagnosis method for diagnosing a state of a plasma processing apparatus according to one aspect of the invention, the apparatus diagnosis method includes: a step of previously obtaining prior distribution information including a probability distribution function for each of first sensors by using first sensor values obtained by the first sensors in a first plasma processing apparatus; a step of estimating a probability distribution in each of second sensors corresponding to each of the first sensors based on the previously obtained prior distribution information and second sensor values obtained by the second sensors in a second plasma processing apparatus; and a step of diagnosing a state of the second plasma processing apparatus by using the estimated probability distribution.

Advantageous Effect

According to the aspect of the invention, the probability distribution can be estimated with a small amount of sensor values in the apparatus diagnosis device.

BRIEF DESCRIPTION OF DRAWINGS

FIG. 1 is a configuration diagram of an apparatus diagnosis device of a plasma processing apparatus according to an embodiment.

FIG. 2 is a diagram showing an example of data stored in a sensor value storage unit of the plasma processing apparatus.

FIG. 3 is a flowchart showing a processing of a common unit of the apparatus diagnosis device using sensor values of an apparatus group A.

FIG. 4 is a diagram showing an example of data stored in a prior distribution storage unit of the apparatus diagnosis device.

FIG. 5 is a flowchart showing a processing of an individual control unit of the apparatus diagnosis device.

FIG. 6A is a diagram showing an example of data stored in a probability distribution storage unit of the apparatus diagnosis device before probability distribution determination.

FIG. 6B is a diagram showing an example of data stored in the probability distribution storage unit of the apparatus diagnosis device after the probability distribution determination.

FIG. 7 is a diagram showing an example of data stored in an apparatus diagnosis value storage unit of the apparatus diagnosis device.

FIG. 8 is a diagram showing an example of a display screen of an apparatus diagnosis result.

FIG. 9 is a diagram showing an example of a display screen of a probability distribution estimation result.

FIG. 10 is a configuration diagram of the plasma processing apparatus according to the embodiment.

DESCRIPTION OF EMBODIMENTS

Hereinafter, an embodiment will be described with reference to the drawings. In all the drawings that describe the embodiment, the same components are denoted by the same reference numerals in principle, and a repetitive description thereof is omitted.

(1) Plasma Processing Apparatus

A configuration of a plasma processing apparatus 1 will be described with reference to FIG. 1.

As shown in FIG. 1, the plasma processing apparatus 1 includes a processing unit 10 and a storage unit 11. The processing unit 10 processes a wafer (a sample 102) by generating plasma 101 inside a processing chamber 104 according to set processing conditions.

The storage unit 11 includes a sensor value storage unit 12 and a management value storage unit 13. The sensor value storage unit 12 stores, as time series data, a measurement value of a sensor 103 of an apparatus during wafer processing in each set processing step. For example, the sensor 103 forms a state sensor group and measures a temperature or a pressure.

Based on the time series data, the sensor value storage unit 12 calculates and stores a main statistical value (for example, an average value or a standard deviation) for use in apparatus diagnosis. In the present embodiment, the statistical value will be used as a sensor value thereafter.

An example of data stored in the sensor value storage unit 12 will be described with reference to FIG. 2.

In FIG. 2, the average value is used as the statistical value. Each column of the sensor value corresponds to each type of the sensor, and each row corresponds to each wafer. Information such as an apparatus ID, a processing step ID, a processing condition ID, and a wafer ID is also stored together with the sensor value. The apparatus ID is information for specifying the plasma processing apparatus 1 that performs a processing. The processing step ID and the processing condition ID are information for specifying processing steps and processing conditions, respectively, and are used to specify a target to be monitored. The wafer ID stores information for specifying a processed wafer. The management value storage unit 13 stores a management value such as a processing date and time or the processing conditions.

(2) Apparatus Diagnosis Device

A configuration of an apparatus diagnosis device 2 will be described with reference to FIG. 1.

As shown in FIG. 1, the apparatus diagnosis device 2 is a computer including a common unit 20, an individual control unit 23, and a storage unit 26. The apparatus diagnosis device 2 and an apparatus group 3 including the plasma processing apparatuses 1 are connected to each other via a network, and data communication is possible therebetween.

The present embodiment discloses that the apparatus group 3 is divided into an existing apparatus group A in which a large amount of sensor values are accumulated and an apparatus group B in which a large amount of sensor values are not accumulated due to apparatus startup or the like and which is an apparatus diagnosis target.

As long as there is the plasma processing apparatus 1 as a reference, the apparatus group A does not necessarily have to include a plurality of plasma processing apparatuses 1. In addition, the apparatus group B which is a diagnosis target also does not necessarily have to include the plurality of plasma processing apparatuses 1. Furthermore, the apparatus group A and the apparatus group B may share a same plasma processing apparatus.

The common unit 20 includes a common distribution function selection unit 21 and a prior distribution setting unit 22, and, before the apparatus diagnosis of the apparatus group B is performed, previously performs a processing of extracting prior distribution information for each sensor based on the sensor values accumulated in the apparatus group A and storing the prior distribution information in a prior distribution storage unit 27 included in the storage unit 26. An example of processing contents of the common unit 20 will be described in (3) Processing of Common Unit described later.

The individual control unit 23 includes a probability distribution estimation unit 24 and an apparatus state diagnosis unit 25. The probability distribution estimation unit 24 estimates, as a posterior distribution, a probability distribution for each sensor 103 based on the sensor values of the corresponding plasma processing apparatus in the apparatus group B obtained during the apparatuses state diagnosis and the extracted prior distribution information, and stores the probability distribution into a probability distribution storage unit 28.

Then, based on the estimated probability distribution of the sensor values, the apparatus state diagnosis unit 25 calculates an apparatus state value such as an inter-apparatus difference, and stores the apparatus state value into an apparatus diagnosis values storage unit 29. An example of processing contents of the individual control unit 23 will be described in (4) Processing of Individual Processing Unit described later.

An output unit 40 and an input unit 41 are connected to the apparatus group 3 and the apparatus diagnosis device 2. The output unit 40 is, for example, a display or a printer, and is a device that graphically outputs the information to a user based on the information in the storage unit 26. A display example will be described in (5) Display Example of Output Unit described later. The input unit 41 is, for example, an input device such as a mouse or a keyboard that receives an information input by a user operation.

(3) Processing of Common Unit

An example of a processing of setting a prior distribution using the sensor values of the apparatus group A performed by the common unit 20 of the apparatus diagnosis device 2 will be described with reference to FIG. 3.

Before the processing of the common unit 20 is performed, in each plasma processing apparatus 1 of the apparatus group A, the sensor values, which are plasma processing histories in the processing steps for the target to be monitored, are previously stored into the sensor value storage unit 12.

As the processing steps for the target to be monitored, a plasma processing (for example, an aging processing or a cleaning processing) for adjusting a state of the processing unit 10 commonly performing a plurality of steps is specified. The sensor values of the specified processing step ID are obtained from the sensor value storage unit 12 of the apparatus group A. (S101)

In this way, by using the sensor values of the plasma processing commonly performed in the plurality of steps, for example, even when the apparatus group B is applied to a new step, the sensor values accumulated by the apparatus group A can be used for setting the prior distribution.

Next, the prior distribution setting unit 22 executes processings of S103 and S104 for each sensor 103 and each probability distribution function candidate. Here, the probability distribution function candidate is obtained by setting in advance, as a candidate, a probability distribution function of each sensor 103 of the plasma processing apparatus 1. For example, a normal distribution, a distortion normal distribution, a mixed normal distribution, and a Cauchy distribution are set as the probability distribution function candidate (S102).

The prior distribution setting unit 22 estimates a probability distribution parameter of the probability distribution function candidate for the sensor values of the sensor 103. The probability distribution parameter is, for example, a value corresponding to an average value and a standard deviation if the probability distribution function candidate is the normal distribution, and includes different types for each probability distribution function. For example, a Markov chain Monte Carlo method (MCMC method) is used to estimate the probability distribution parameter. The MCMC method is a method of estimating the posterior distribution of the probability distribution parameter by considering the probability distribution parameter as a random variable and then generating a large number of random samples based on a product of the likelihood and the prior distribution of the probability distribution parameter proportional to the posterior distribution of the probability distribution parameter (S103).

The estimated probability distribution parameter is obtained as the probability distribution, and is uniquely determined, for example, based on a value having a maximum posterior probability. Using the probability distribution at this time, the prior distribution setting unit 22 calculates a log likelihood that is a degree of fitting to the obtained sensor values of the apparatus group A (S104).

Finally, the common distribution function selection unit 21 selects, from the probability distribution function candidates, a probability distribution function having a maximum log likelihood as the probability distribution function common in the apparatus group A for each sensor 103. In addition, an estimated value of the probability distribution parameter regarding the selected probability distribution function is stored, as the prior distribution when the probability distribution of the sensor values of the apparatus group B is estimated, into the prior distribution storage unit 27. In addition, together with the probability distribution function having the maximum log likelihood, an estimated value of the probability distribution parameter regarding the normal distribution is also stored into the prior distribution storage unit 27 (S105).

An example of data stored in the prior distribution storage unit 27 will be described with reference to FIG. 4.

FIG. 4 shows a form in which the prior distribution information is stored for each sensor. A row of the probability distribution function stores names of the probability distribution function selected in S105 of FIG. 3. A row of the probability distribution parameter stores the prior distribution of each probability distribution parameter set using the posterior distribution of the probability distribution parameter estimated in S103 of FIG. 3. As an example, the normal distribution including the average value and the standard deviation of the posterior distribution is set as the prior distribution of each probability distribution parameter. A row of the log likelihood stores the log likelihood calculated in S104 of FIG. 3.

In this way, by using, as the prior distribution information, the probability distribution function having a maximum commonality in the apparatus group obtained by using the sensor values of the apparatus group A, the prior distribution that can be commonly used for the apparatus group B can be extracted, and the probability distribution can be estimated with a small amount of sensor values even when in a non-normal distribution.

(4) Processing of Individual Control Unit

An example of the estimation of the probability distribution and a processing of the apparatus diagnosis performed by the individual control unit 23 of the apparatus diagnosis device 2 will be described with reference to FIG. 5.

The sensor values of the processing step ID specified in S101 of FIG. 3 is obtained from the sensor value storage unit 12 of the plasma processing apparatus 1 which is included in the apparatus group B and is a diagnosis target (S201).

The probability distribution estimation unit 24 executes processings of S203 to S205 for each sensor having the obtained sensor values (S202).

First, the prior distribution information corresponding to the sensor is obtained from the prior distribution storage unit 27 (S203).

Next, after the obtained prior distribution information is set as the prior distribution, the posterior distribution of the probability distribution parameter is estimated by the MCMC method using the obtained sensor values. Using the estimated probability distribution parameter, the log likelihood for the sensor values is calculated in the same manner as S104 in FIG. 3. This processing is performed for both cases of the probability distribution function selected in S105 of FIG. 3 and the normal distribution (S204).

Next, the log likelihood is compared between the probability distribution estimated by using the probability distribution function selected in S105 of FIG. 3 and the probability distribution estimated by using the normal distribution, a probability distribution having a larger log likelihood is set as an estimation result for the sensor and is stored in the probability distribution storage unit 28 (S205).

In this way, robustness of the estimation result can be improved by determining the probability distribution function together with the sensor values of the apparatus group B.

An example of data stored in the probability distribution storage unit 28 before and after probability distribution determination for each sensor will be described with reference to FIGS. 6A and 6B.

As shown in FIGS. 6A and 6B, probability distribution information is stored for each sensor shown in each column of sensor names. The stored probability distribution information includes the probability distribution function, the probability distribution parameter, and the log likelihood, as in FIG. 4.

The probability distribution parameter may store the posterior distribution estimated in the same manner as in FIG. 4, or may store a uniquely determined value such as the value having the maximum posterior probability as in FIGS. 6A and 6B. Of two probability distribution functions including the normal distribution in each sensor in FIG. 6A, a situation after the probability distribution having the larger log likelihood is determined corresponds to FIG. 6B.

Finally, an apparatus diagnosis value is calculated using the data stored in the probability distribution storage unit 28 (S206). For example, when the inter-apparatus difference is calculated as the apparatus diagnosis value, first, the probability distribution information of the plasma processing apparatus 1 as the reference and the plasma processing apparatus 1 as the diagnosis target is obtained from the probability distribution storage unit 28. A distance between the obtained probability distributions is stored, as an inter-apparatus difference diagnosis value, into the apparatus diagnosis value storage unit 29. As a distance index between the probability distributions, Kullback-Leibler divergence, Jensen-Shannon divergence, or the like is used.

An example of data stored in the apparatus diagnosis value storage unit 29 when the inter-apparatus difference is calculated as the apparatus diagnosis value will be described with reference to FIG. 7.

As shown in FIG. 7, a row of the apparatus ID stores ID for specifying two plasma processing apparatuses 1 to be compared. A row of the inter-apparatus difference diagnosis value stores the inter-apparatus difference diagnosis value calculated for each sensor.

(5) Display Example of Output Unit

The output unit 40 uses the information stored in the storage unit 11 or the storage unit 26 to display a diagnosis result of an apparatus state or a probability distribution estimation result.

An example of a display screen D100 of an inter-apparatus difference diagnosis result will be described with reference to FIG. 8.

As shown in FIG. 8, an apparatus of interest ID is input to D102. Accordingly, the inter-apparatus difference diagnosis values of the corresponding apparatus ID stored in the apparatus diagnosis value storage unit 29 are obtained and displayed as a graph for each sensor as in D104. As a result, a sensor having a larger inter-apparatus difference from the plasma processing apparatus 1 as the reference can be determined and can be used for adjustment or the like.

The sensor 103 can be generally classified into a plurality of groups according to a measurement target component, a measurement target item, or the like. The sensors are previously registered as sensor groups, and the inter-apparatus difference diagnosis values of each sensor belonging to the same sensor group are integrated and the inter-apparatus difference diagnosis values are displayed for each sensor group, as in D103. Thus, a component as an adjustment target is clear.

By integrating the inter-apparatus difference diagnosis values of all the sensors, a comparison for each plasma processing apparatus 1 is also displayed as in D101.

An example of a screen D105 for confirming a distribution of the sensor values and the probability distribution estimation result stored in the probability distribution storage unit 28 will be described with reference to FIG. 9.

As shown in FIG. 9, the apparatus ID and the sensor name are input, a target to be confirmed is determined, and then a graph is displayed. By inputting a plurality of apparatus IDs, a comparison display can be performed. A histogram is a histogram of measurement values of the sensor values stored in the sensor value storage unit 12, and a solid line is the probability distribution estimation result stored in the probability distribution storage unit 28.

For example, in FIG. 9, the histogram of the sensor values of a sensor name X2 of apparatuses having apparatus IDs C1 and C4 and the probability distribution estimation result are displayed. Accordingly, the user can confirm whether the estimated probability distribution is valid. In addition, for example, if two probability distributions to be compared move in parallel, an initialization of the sensor 103 can be utilized in a consideration of devising a measure against an apparatus diagnosis result, such as examination.

In this way, as shown in FIGS. 8 and 9, the output unit 40 outputs, as the diagnosis value of the state of the plasma processing apparatus 1, a difference in the probability distribution between the plasma processing apparatuses, and also outputs a transition width over time of the probability distribution.

According to the above embodiment, in the plasma processing apparatus, for example, when starting up the apparatus or applying the apparatus to the new step or adjusting the apparatus before shipping, even when a large amount of sensor values of the diagnosis target apparatus cannot be obtained, the apparatus diagnosis can be performed by extracting the prior distribution information common in the existing apparatus group and then estimating the probability distribution including the non-normal distribution together with the sensor values newly obtained in the diagnosis target apparatus.

Although the embodiment has been described above, the invention is not limited to the above embodiment, and various modifications can be made without departing from the scope of the invention.

For example, although FIG. 1 shows a configuration in which the apparatus diagnosis device 2 and the plasma processing apparatus 1 are connected via the network, the invention is not limited to the above configuration, and as shown in FIG. 10, the plasma processing apparatus 1 may be configured to include the apparatus diagnosis device 2. In this case, the plasma processing apparatus 1 includes the processing chamber 104 in which the sample 102 is plasma-processed and the apparatus diagnosis device 2 for diagnosing a state of a self-apparatus.

As shown in FIG. 10, the plasma processing apparatus 1 includes the processing unit 10 and the storage unit 11 shown in FIG. 1. The processing unit 10 processes the wafer (the sample 102) by generating the plasma 101 inside the processing chamber 104 according to the set processing conditions.

In addition, the apparatus diagnosis device 2 includes the common unit 20, the individual control unit 23, and the storage unit 26, similarly to the configuration shown in FIG. 1.

REFERENCE SIGN LIST 1 plasma processing apparatus
2 apparatus diagnosis device
3 apparatus group
10 processing unit
11 storage unit
12 sensor value storage unit
13 management value storage unit
20 common unit
21 common distribution function selection unit
22 prior distribution setting unit
23 individual control unit
24 probability distribution estimation unit
25 apparatus state diagnosis unit
26 storage unit
27 prior distribution storage unit
28 probability distribution storage unit
29 apparatus diagnosis value storage unit
40 output unit
41 input unit

The invention claimed is:

1. A diagnosis apparatus for diagnosing a state of a plasma processing apparatus, comprising:
a computer configured to be operatively coupled via a network to at least a first group comprising a plurality of first plasma processing apparatuses and a second group comprising a plurality of second plasma processing apparatuses,
wherein the computer is configured to
obtain, via said network, prior distribution information comprising plasma processing histories stored by at least one of said first plasma processing apparatuses, said prior distribution information including a probability distribution function for each of a plurality of first sensors by using first sensor values obtained by the first sensors of at least one of said first plasma processing apparatuses;
calculate a plurality of probability distribution functions for each of a plurality of second sensors corresponding to each of the plurality of first sensors, wherein the plurality of probability distribution functions comprises a normal distribution, a distortion normal distribution, a mixed normal distribution, and a Cauchy distribution;
calculate an estimated probability for each of the plurality of calculated probability distribution functions for each of the plurality of second sensors corresponding to each of the plurality of first sensors based on the obtained prior distribution information and second sensor values obtained by the second sensors of a second plasma processing apparatus different from the first plasma processing apparatus;
calculate a plurality of log likelihood values for a degree of fit of the estimated probability for each of the plurality of calculated probability distribution functions for each of the plurality of second sensors;
select, by said computer, one of said plurality of calculated probability distribution functions for each of the plurality of second sensors;
store, for each of the plurality of second sensors, the selected calculated probability distribution function and the normal distribution;
extract one of said plurality of calculated probability distribution functions having a maximum commonality for the plurality of second plasma processing apparatuses; and
cause a state of one of said second plasma processing apparatuses to be diagnosed using the extracted probability distribution function.

2. The diagnosis apparatus according to claim 1, wherein the plurality of first plasma processing apparatuses comprises two or more of said first plasma processing apparatuses, and
the probability distribution function previously obtained in each of the first sensors is a most frequent probability distribution function obtained for the first plasma processing apparatus among probability distribution functions obtained for the first plasma processing apparatuses.

3. A diagnosis apparatus for diagnosing a state of a plasma processing apparatus, comprising:
a computer configured to be operatively coupled via a network to at least a first group comprising a plurality of first plasma processing apparatuses and a second group comprising a plurality of second plasma processing apparatuses,
wherein the computer is configured to
obtain, via said network, prior distribution information comprising plasma processing histories stored by at least one of said first plasma processing apparatuses, said prior distribution information including a probability distribution function for each of a plurality of first sensors by using first sensor values obtained by first sensors of at least one of said first plasma processing apparatuses;
calculate a plurality of probability distribution functions for each of a plurality of second sensors corresponding to each of the plurality of first sensors, wherein the plurality of probability distribution functions comprises a normal distribution, a distortion normal distribution, a mixed normal distribution, and a Cauchy distribution;
calculate an estimated probability for each of the plurality of calculated probability distribution functions for each of the plurality of second sensors corresponding to each of the plurality of first sensors based on the obtained prior distribution information and second sensor values obtained by the second sensors of a second plasma processing apparatus different from the first plasma processing apparatus;
calculate a plurality of log likelihood values for a degree of fit of the estimated probability for each of the plurality of calculated probability distribution functions for each of the plurality of second sensors;

select, by said computer, one of said plurality of calculated probability distribution functions for each of the plurality of second sensors;

store, for each of the plurality of second sensors, the selected calculated probability distribution function and the normal distribution;

compare a first of the plurality of log likelihood values that is a likelihood of the estimated probability distribution and a second of the plurality of log likelihood values that is a likelihood of a normal distribution;

when the first log likelihood value is higher than the second log likelihood value, cause a state of the second plasma processing apparatus to be diagnosed using an estimated probability distribution function other than the normal distribution; and when the second log likelihood value is higher than the first log likelihood value, cause the state of the second plasma processing apparatus to be diagnosed using the normal distribution.

4. The diagnosis apparatus according to claim 1, wherein the probability distribution is estimated by using a Markov chain Monte Carlo method.

5. The diagnosis apparatus according to claim 1, wherein the computer is further configured to output a difference in the probability distribution between the plasma processing apparatuses is output as a diagnosis value of the state of the second plasma processing apparatus, and output a transition width over time of the probability distribution.

6. A plasma processing apparatus comprising:

a processing chamber in which a sample is plasma-processed; and a diagnosis apparatus comprising a computer configured to diagnose a state of the plasma processing apparatus, wherein the computer is configured to obtain, via said network, prior distribution information comprising plasma processing histories stored by at least one of said first plasma processing apparatuses, said prior distribution information including a probability distribution function for each of a plurality of first sensors by using first sensor values obtained by the first sensors of at least one of said first plasma processing apparatuses;

calculate a plurality of probability distribution functions for each of a plurality of second sensors corresponding to each of the plurality of first sensors, wherein the plurality of probability distribution functions comprises a normal distribution, a distortion normal distribution, a mixed normal distribution, and a Cauchy distribution;

calculate an estimated probability for each of the plurality of calculated probability distribution functions for each of the plurality of second sensors corresponding to each of the plurality of first sensors based on the obtained prior distribution information and second sensor values obtained by the second sensors of a second plasma processing apparatus different from the first plasma processing apparatus;

calculate a plurality of log likelihood values for a degree of fit of the estimated probability for each of the plurality of calculated probability distribution functions for each of the plurality of second sensors;

select, by said computer, one of said plurality of calculated probability distribution functions for each of the plurality of second sensors;

store, for each of the plurality of second sensors, the selected calculated probability distribution function and the normal distribution;

extract one of of said plurality of calculated probability distribution functions having a maximum commonality for the plurality of second plasma processing apparatuses; and cause a state of one of said second plasma processing apparatuses to be diagnosed using the extracted probability distribution function.

7. A diagnosis method for diagnosing a state of a plasma processing apparatus, the apparatus diagnosis method comprising:

a step of obtaining, via a network, prior distribution information comprising plasma processing histories stored by a first plasma processing apparatus, said prior distribution information including a probability distribution function for each of a plurality of first sensors by using first sensor values obtained by the first sensors in a first plasma processing apparatus;

a step of calculating a plurality of probability distribution functions for each of a plurality of second sensors corresponding to each of the plurality of first sensors, wherein the plurality of probability distribution functions comprises a normal distribution, a distortion normal distribution, a mixed normal distribution, and a Cauchy distribution;

a step of calculating an estimated probability for each of the plurality of calculated probability distribution functions for each of the plurality of second sensors corresponding to each of the plurality of first sensors based on the obtained prior distribution information and second sensor values obtained by the second sensors in a second plasma processing apparatus;

a step of calculating a plurality of log likelihood values for a degree of fit of the estimated probability for each of the plurality of calculated probability distribution functions for each of the plurality of second sensors;

a step of selecting, by said computer, one of said plurality of calculated probability distribution functions for each of the plurality of second sensors;

a step of storing, for each of the plurality of second sensors, the selected calculated probability distribution function and the normal distribution;

a step of extracting one of of said plurality of calculated probability distribution functions having a maximum commonality for the plurality of second plasma processing apparatuses; and a step of causing a state of the second plasma processing apparatus to be diagnosed using the extracted probability distribution function.

* * * * *